(12) United States Patent
Yokoyama

(10) Patent No.: US 12,484,447 B2
(45) Date of Patent: Nov. 25, 2025

(54) PIEZOELECTRIC ACTUATOR, LIQUID EJECTING HEAD, AND RECORDING APPARATUS

(71) Applicant: Seiko Epson Corporation, Tokyo (JP)

(72) Inventor: Naoto Yokoyama, Matsumoto (JP)

(73) Assignee: Seiko Epson Corporation, Tokyo (JP)

( * ) Notice: Subject to any disclaimer, the term of this patent is extended or adjusted under 35 U.S.C. 154(b) by 999 days.

(21) Appl. No.: 17/646,839

(22) Filed: Jan. 3, 2022

(65) Prior Publication Data

US 2022/0216393 A1 Jul. 7, 2022

(30) Foreign Application Priority Data

Jan. 4, 2021 (JP) .................................. 2021-000275

(51) Int. Cl.
| | | |
|---|---|---|
| *H01L 41/09* | (2006.01) | |
| *B41J 2/14* | (2006.01) | |
| *H10N 30/20* | (2023.01) | |
| *H10N 30/87* | (2023.01) | |

(52) U.S. Cl.
CPC ...... *H10N 30/2047* (2023.02); *B41J 2/14233* (2013.01); *H10N 30/87* (2023.02)

(58) Field of Classification Search
CPC ........................... H10N 30/2047; H10N 30/87
See application file for complete search history.

(56) References Cited

U.S. PATENT DOCUMENTS

| | | | |
|---|---|---|---|
| 2018/0086069 A1* | 3/2018 | Kakiuchi | H10N 30/20 |
| 2019/0077151 A1* | 3/2019 | Hirai | B41J 2/1628 |
| 2019/0084306 A1* | 3/2019 | Morozumi | B41J 2/14233 |
| 2019/0232659 A1* | 8/2019 | Takabe | H10N 30/883 |

FOREIGN PATENT DOCUMENTS

JP 2012-161958 8/2012

* cited by examiner

*Primary Examiner* — Bryan P Gordon
(74) *Attorney, Agent, or Firm* — WORKMAN NYDEGGER

(57) ABSTRACT

A plurality of individual electrodes each extending in a first direction are arranged in a second direction intersecting with the first direction. A piezoelectric actuator has a drive region where the individual electrode, a piezoelectric layer, and a common electrode overlap as viewed in a stack direction and a non-drive region, adjacent to the drive region, where the individual electrode, the piezoelectric layer, and the common electrode do not overlap as viewed in the stack direction. The individual electrode has a first portion included in the drive region and a second portion included in the non-drive region and located adjacent to the first portion in the first direction. The first portion includes a narrower portion whose width is less than a width in the second direction at a boundary between the first portion and the second portion.

12 Claims, 11 Drawing Sheets

FIG. 11
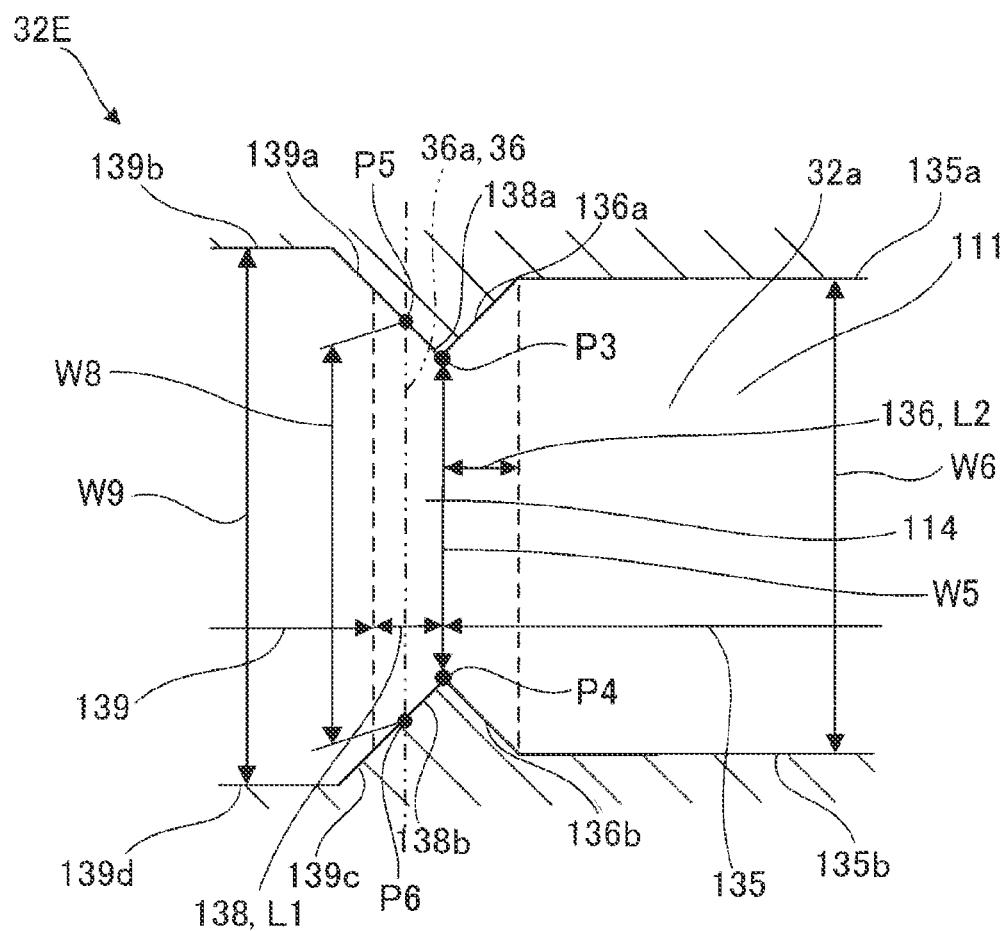
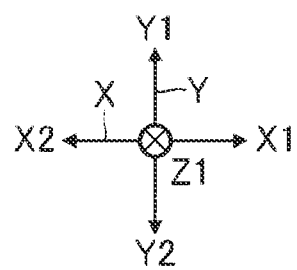

FIG. 12
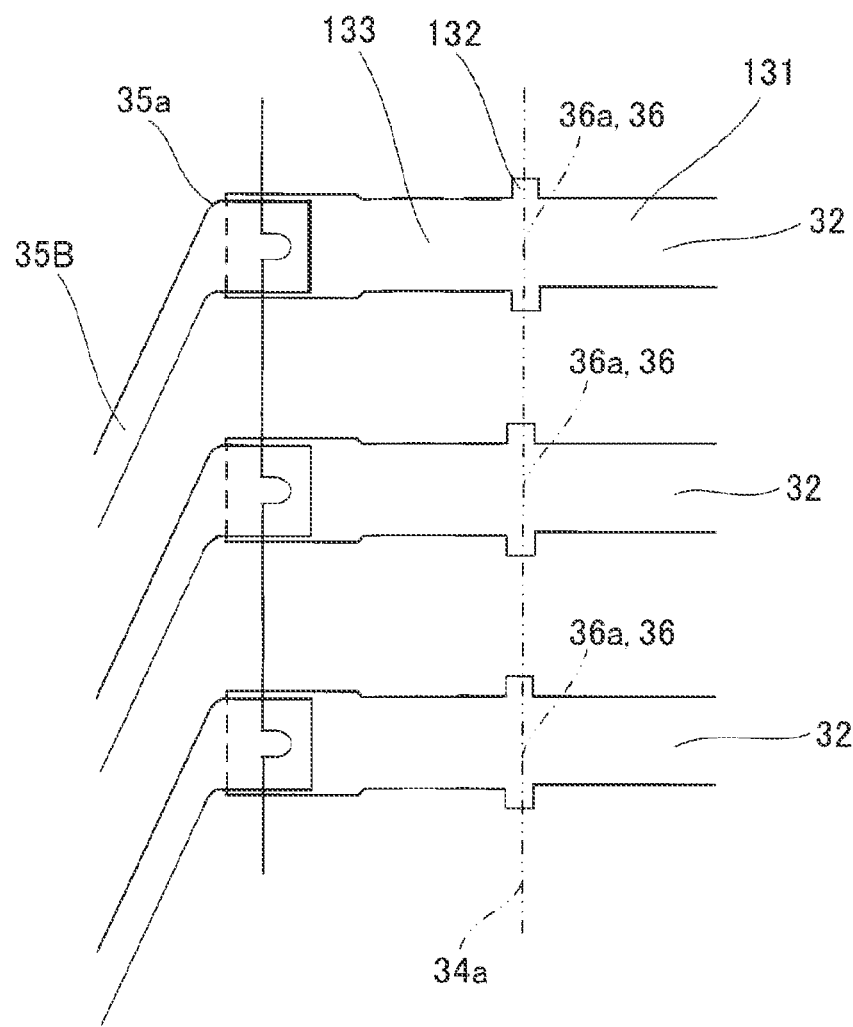
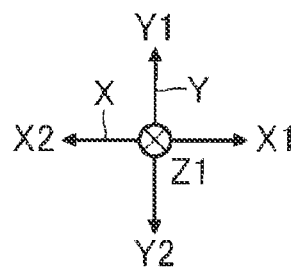

PIEZOELECTRIC ACTUATOR, LIQUID EJECTING HEAD, AND RECORDING APPARATUS

The present application is based on, and claims priority from JP Application Serial Number 2021-000275, filed Jan. 4, 2021, the disclosure of which is hereby incorporated by reference herein in its entirety.

BACKGROUND

1. Technical Field

Embodiments of the present disclosure relate to a piezoelectric actuator, a liquid ejecting head, and a recording apparatus.

2. Related Art

A liquid ejecting apparatus equipped with a liquid ejecting head configured to eject liquid such as ink is known. A liquid ejecting head disclosed in JP2012-161958 includes piezoelectric actuators configured to drive a diaphragm disposed over pressure compartments. The piezoelectric actuators include a plurality of individual electrodes, a piezoelectric layer disposed in such a way as to cover the plurality of individual electrodes, and a common electrode disposed in such a way as to cover the piezoelectric layer.

In a piezoelectric actuator, the portion, of a piezoelectric layer, sandwiched between an individual electrode and a common electrode behaves as a drive region. A non-drive region is formed around the drive region. There is a risk that the individual electrode might be damaged due to stress concentration that occurs at an end portion of the individual electrode near the boundary between the drive region and the non-drive region.

SUMMARY

A piezoelectric actuator according to a certain aspect of the present disclosure includes a plurality of individual electrodes, a piezoelectric layer, and a common electrode that are stacked in layers on a diaphragm. The plurality of individual electrodes each extending in a first direction are arranged in a second direction intersecting with the first direction. The piezoelectric actuator has a drive region where the individual electrode, the piezoelectric layer, and the common electrode overlap as viewed in a stack direction (Z) and a non-drive region, adjacent to the drive region, where the individual electrode, the piezoelectric layer, and the common electrode do not overlap as viewed in the stack direction. The individual electrode has a first portion included in the drive region and a second portion included in the non-drive region and located adjacent to the first portion in the first direction. The first portion includes a narrower portion whose width is less than a width in the second direction at a boundary between the first portion and the second portion.

A liquid ejecting head according to a certain aspect of the present disclosure includes the above piezoelectric actuator and a pressure compartment forming substrate, inside which pressure compartments are formed. The drive region is located over the pressure compartment.

A recording apparatus according to a certain aspect of the present disclosure includes the above liquid ejecting head.

BRIEF DESCRIPTION OF THE DRAWINGS

FIG. 11 is a plan view of an end structure of a lower electrode according to a fourth modification example.

FIG. 12 is a plan view of lower electrodes and lead electrodes according to a fifth modification example.

DESCRIPTION OF EXEMPLARY EMBODIMENTS

Figure 1:
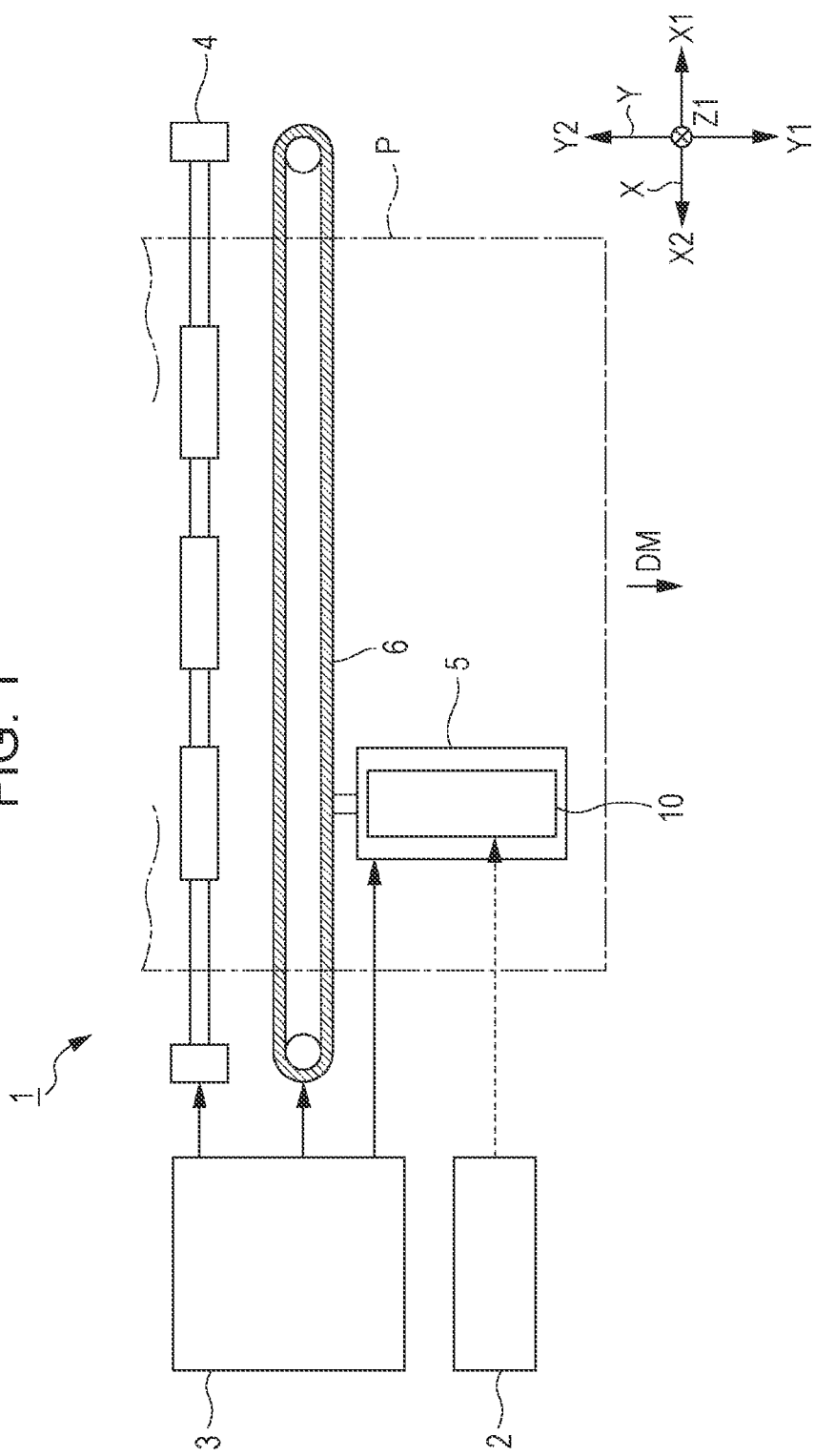
FIG. 1 is a schematic diagram that illustrates a liquid ejecting apparatus according to a first embodiment.

With reference to the accompanying drawings, an exemplary embodiment of the present disclosure will now be explained. In the drawings, the dimensions and scales of components may be made different from those in actual implementation. Since the embodiment described below shows some preferred examples of the present disclosure, they contain various technically-preferred limitations. However, the scope of the present disclosure shall not be construed to be limited to the examples described below unless and except where any intention of restriction is mentioned explicitly.

In the description below, three directions that are orthogonal to one another will be referred to as X-axis direction, Y-axis direction, and Z-axis direction. The X-axis direction includes X1 direction and X2 direction, which are the opposite of each other. The Y-axis direction includes Y1 direction and Y2 direction, which are the opposite of each other. The Z-axis direction includes Z1 direction and Z2 direction, which are the opposite of each other. The Z1 direction is the direction going down. The Z2 direction is the direction going up. In this specification, the terms "upper" and "lower" will be used. The terms "upper" and "lower" as used herein correspond to the ordinary meaning of "upper" and "lower" in a normal state of use, in which nozzles are directed vertically downward, of a liquid ejecting apparatus 1.

The X-axis direction, the Y-axis direction, and the Z-axis direction are orthogonal to one another. In an ordinary configuration, the Z-axis direction is along the vertical direction. However, the Z-axis direction is not necessarily along the vertical direction.

FIG. 1 is a schematic diagram that illustrates an example of the configuration of a liquid ejecting apparatus 1 according to a first embodiment. The liquid ejecting apparatus 1 is an ink-jet-type printing apparatus that ejects droplets of ink, which is an example of "liquid", onto a medium P. The liquid ejecting apparatus 1 according to the present embodiment is a head-scan-type printing apparatus also called as a serial-type printer that reciprocates a plurality of nozzles, from which ink is ejected, in the direction of the width of the medium P. The medium P is, typically, printing paper such as plain paper, coated paper, glossy paper, etc. The medium P is not limited to printing paper. The medium P may be a print target made of any material such as, for example, a resin film or a cloth. The liquid ejecting apparatus 1 is an example of a recording apparatus.

As illustrated in FIG. 1, the liquid ejecting apparatus 1 includes a liquid container 2 that contains ink. Some specific examples of the liquid container 2 are: a cartridge that can be detachably attached to the liquid ejecting apparatus 1, a bag-type ink pack made of a flexible film material, an ink tank which can be refilled with ink, etc. Any type of ink may be contained in the liquid container 2. The liquid container 2 is an example of a liquid containing unit.

In an ordinary configuration, the liquid container 2 includes a first liquid container and a second liquid container, though not illustrated. The liquid container 2 may be a single liquid container instead. The first liquid container contains first ink. The second liquid container contains second ink, the type of which is different from the type of the first ink. For example, the color of the first ink and the color of the second ink are different from each other. The first ink and the second ink may be the same type of ink.

The liquid ejecting apparatus 1 includes a control unit 3, a medium transportation mechanism 4, a carriage 5, a carriage transportation mechanism 6, and a plurality of liquid ejecting heads 10. The control unit 3 controls the operation of each component of the liquid ejecting apparatus 1. The control unit 3 includes a processing circuit, for example, a CPU (central processing unit) or an FPGA (field programmable gate array), and a storage circuit such as a semiconductor memory. Various kinds of program and data are stored in the storage circuit. The processing circuit realizes various kinds of control by running the program and using the data.

The medium transportation mechanism 4 is controlled by the control unit 3 and transports the medium P in a transportation direction DM. The transportation direction DM is, for example, the Y1 direction. The transportation direction DM is not limited to the Y1 direction. The transportation direction DM may be the Y2 direction or any other direction. The medium transportation mechanism 4 includes a transportation roller that is elongated in the X-axis direction and a motor that causes the transportation roller to rotate. The configuration of the medium transportation mechanism 4 is not limited to the illustrated example in which the transportation roller is used. For example, a drum that transports the medium P in a state in which the medium P is attracted to the circumferential surface of the drum due to an electrostatic force, etc., or an endless belt, may be used instead.

The plurality of liquid ejecting heads 10 is mounted on the carriage 5. The carriage transportation mechanism 6 is controlled by the control unit 3 and reciprocates the carriage 5 in the X-axis direction. The carriage transportation mechanism 6 includes, for example, an endless belt tensioned around and between plural rollers distanced from each other in the X-axis direction.

Ink flows from the liquid container 2 through an ink flow passage and is then supplied to the liquid ejecting head 10. The liquid ejecting head 10 is controlled by the control unit 3 and ejects ink from each of the plurality of nozzles toward the medium P.

Figure 2:
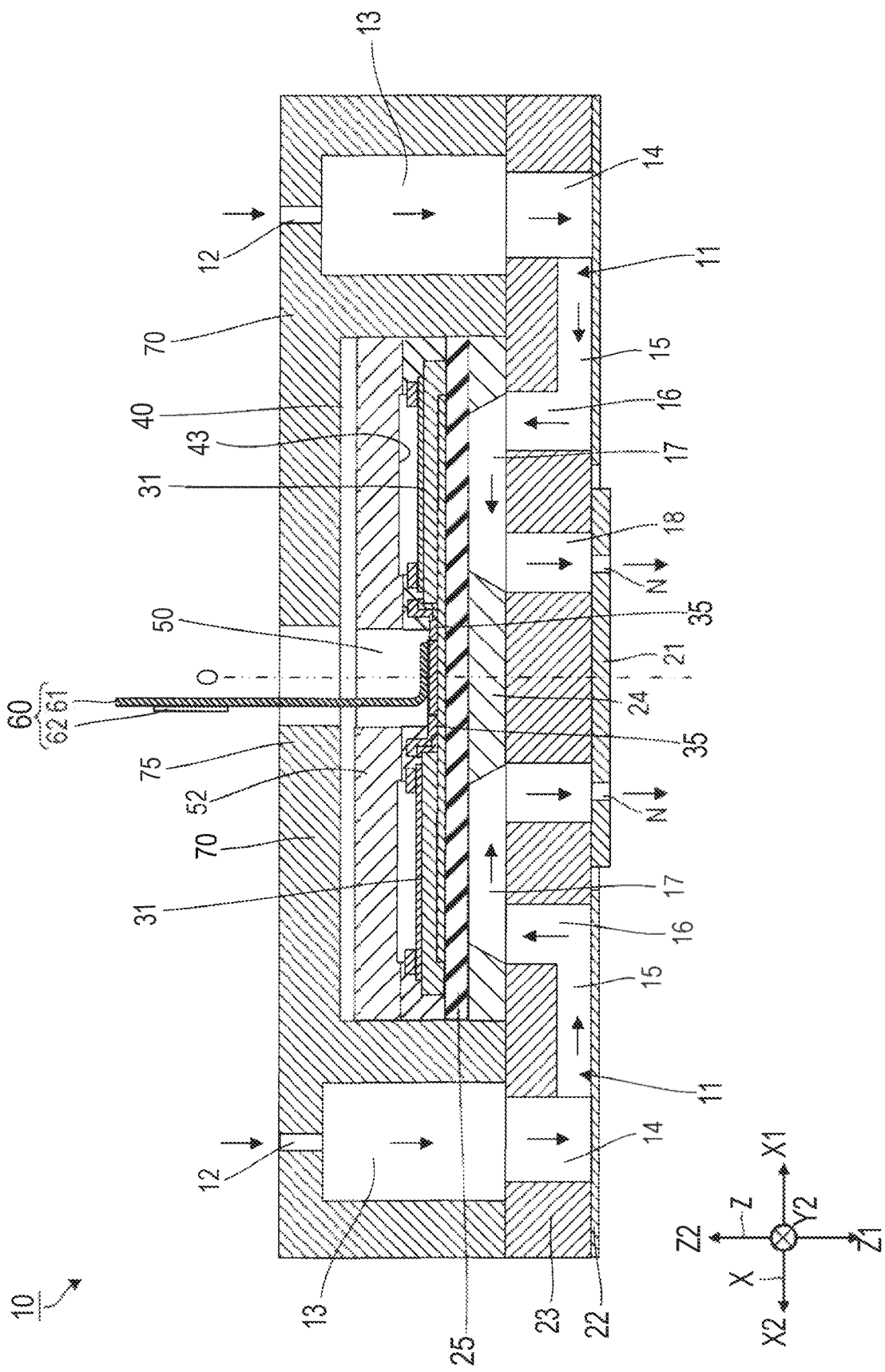
FIG. 2 is a cross-sectional view of a liquid ejecting head.

Next, with reference to FIG. 2, ink flow passages 11 formed inside the liquid ejecting head 10 will now be explained. FIG. 2 is a cross-sectional view of the liquid ejecting head 10 taken along an X-Z plane. The X-Z plane is a plane that is along the X-axis direction and the Z-axis direction. In FIG. 2, the direction in which ink flows inside the liquid ejecting head 10 is indicated by arrows. Flow passages 11 through which ink flows are formed inside the liquid ejecting head 10. The flow passage 11 leads from a supply inlet 12 to a nozzle N. The flow passages 11 are line-symmetric with respect to a center line O extending in the Z-axis direction.

The flow passage 11 includes the supply inlet 12, a common reservoir 13, a common reservoir 14, a relay flow passage 15, a relay flow passage 16, a pressure compartment 17, a communication flow passage 18, and the nozzle N. The supply inlet 12 is provided on both sides in the X-axis direction of the liquid ejecting head 10. The supply inlet 12 is in communication with the common reservoir 13 in the Z-axis direction. The common reservoir 13 is in communication with the common reservoir 14 in the Z-axis direction. The common reservoirs 13 and 14 are formed in different members respectively. The common reservoir 13, 14 extends in the Y-axis direction. The common reservoir 13, 14 is a common space that is in communication with the plurality of pressure compartments 17. The plural pressure compartments 17 are arranged next to one another in the Y-axis direction.

A plurality of relay flow passages 15, 16 is connected to the common reservoir 14. The plurality of relay flow passages 15, 16 is provided such that they correspond to the plurality of pressure compartments 17 respectively. The plural relay flow passages 15 are arranged next to one another in the Y-axis direction. The relay flow passage 15 extends from the outside toward the inside in the X-axis direction. The relay flow passage 16 is connected to the downstream end of the relay flow passage 15. The relay flow passage 16 extends in the Z2 direction from the relay flow passage 15 and is in communication with the pressure compartment 17.

Each of the plurality of pressure compartments 17 extends inward in the X-axis direction. The communication flow passage 18 is connected to the downstream end of the pressure compartment 17 and extends in the Z1 direction. The plurality of communication flow passages 18 is connected to the plurality of pressure compartments 17 respectively. The plurality of communication flow passages 18 is connected to the plurality of nozzles N respectively.

The communication flow passage 18 is located downstream of the pressure compartment 17. The communication flow passage 18 is located at an inner side in the X-axis direction in comparison with the relay flow passage 16. The communication flow passage 18 provides communication between the pressure compartment 17 and the nozzle N. The communication flow passage 18 extends in the Z-axis direction.

Next, the flow of ink inside the liquid ejecting head 10 will now be explained. Ink flows into the liquid ejecting head 10 through the supply inlet 12. The ink having passed through the supply inlet 12 flows into the common reservoir 13 and next into the common reservoir 14. The flow path of the ink from the common reservoir 14 branches into the plurality of relay flow passages 15. The ink in the relay flow passage 15 flows through the relay flow passage 16 into the pressure compartment 17. The pressure of the ink in the pressure compartment 17 is raised by a piezoelectric actuator 31, which will be described later. Due to the rise in pressure, the ink in the pressure compartment 17 flows through the communication flow passage 18 to be ejected from the nozzle N.

Next, the structure of the liquid ejecting head 10 will now be explained. The liquid ejecting head 10 includes a nozzle plate 21, a bottom plate 22, a flow passage forming substrate 23, a pressure compartment forming substrate 24, a diaphragm 25, and the piezoelectric actuators 31. The liquid ejecting head 10 further includes a sealing plate 40 for sealing the piezoelectric actuators 31, a COF 60 coupled to the piezoelectric actuators 31 electrically, and a cover 70 enclosing the sealing plate 40. COF is an acronym for Chip On Film. The sealing plate 40 is an example of a protective substrate.

The supply inlet 12 and the common reservoir 13 are formed in the cover 70. The cover 70 has a cavity for housing the pressure compartment forming substrate 24, the diaphragm 25, the piezoelectric actuators 31, and the sealing plate 40. The cover 70 encloses the sealing plate 40 from the Z1-directional side. The common reservoir 13 is located on both sides outside the sealing plate 40 in the X-axis direction. The cover 70 has an opening 75 at a position corresponding to the opening 50 of the sealing plate 40.

The nozzle plate 21 has the plurality of nozzles N. The nozzle N is a through hole going in a plate-thickness direction. The plate-thickness direction of the nozzle plate 21 is along the Z axis. The nozzles N constitute each nozzle row, that is, a row of nozzles arranged linearly in the Y-axis direction. Plural nozzle rows distanced from each other in the X-axis direction are formed in the nozzle plate 21. The nozzle plate 21 is bonded to the bottom surface of the flow passage forming substrate 23 and covers the communication flow passages 18 from below. The nozzles N are located at respective positions corresponding to the communication flow passages 18.

The bottom plate 22 is disposed outside the nozzle plate 21 in the X-axis direction. The bottom plate 22 is bonded to the bottom surface of the flow passage forming substrate 23 and covers the common reservoir 14 and the relay flow passages 15, 16 from below.

The common reservoir 14, the relay flow passages 15, 16, and the communication flow passages 18 are formed in the flow passage forming substrate 23. The common reservoir 14, the relay flow passages 16, and the communication flow passages 18 are openings going through the flow passage forming substrate 23 in the plate-thickness direction. The plate-thickness direction of the flow passage forming substrate 23 is along the Z axis. The relay flow passage 15 is a groove formed in the bottom surface of the flow passage forming substrate 23.

The pressure compartments 17 are formed in the pressure compartment forming substrate 24. The pressure compartments 17 are openings going through the pressure compartment forming substrate 24 in the plate-thickness direction. The length of the pressure compartment forming substrate 24 in the X-axis direction is less than the length of the flow passage forming substrate 23 in the X-axis direction. The pressure compartment forming substrate 24 is bonded to the top surface of the flow passage forming substrate 23.

Figure 3:
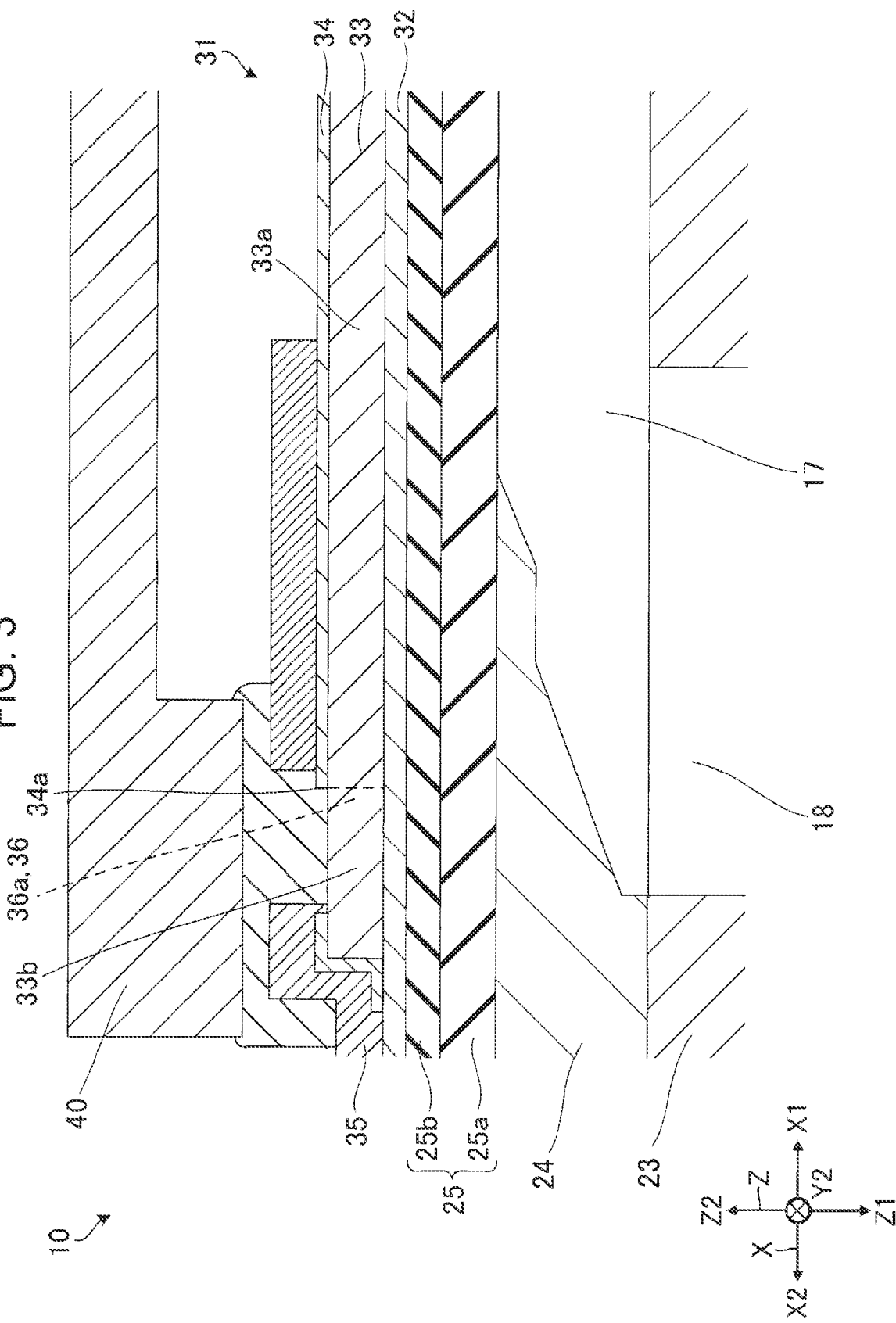
FIG. 3 is an enlarged cross-sectional view of an essential part of the liquid ejecting head.
Figure 4:
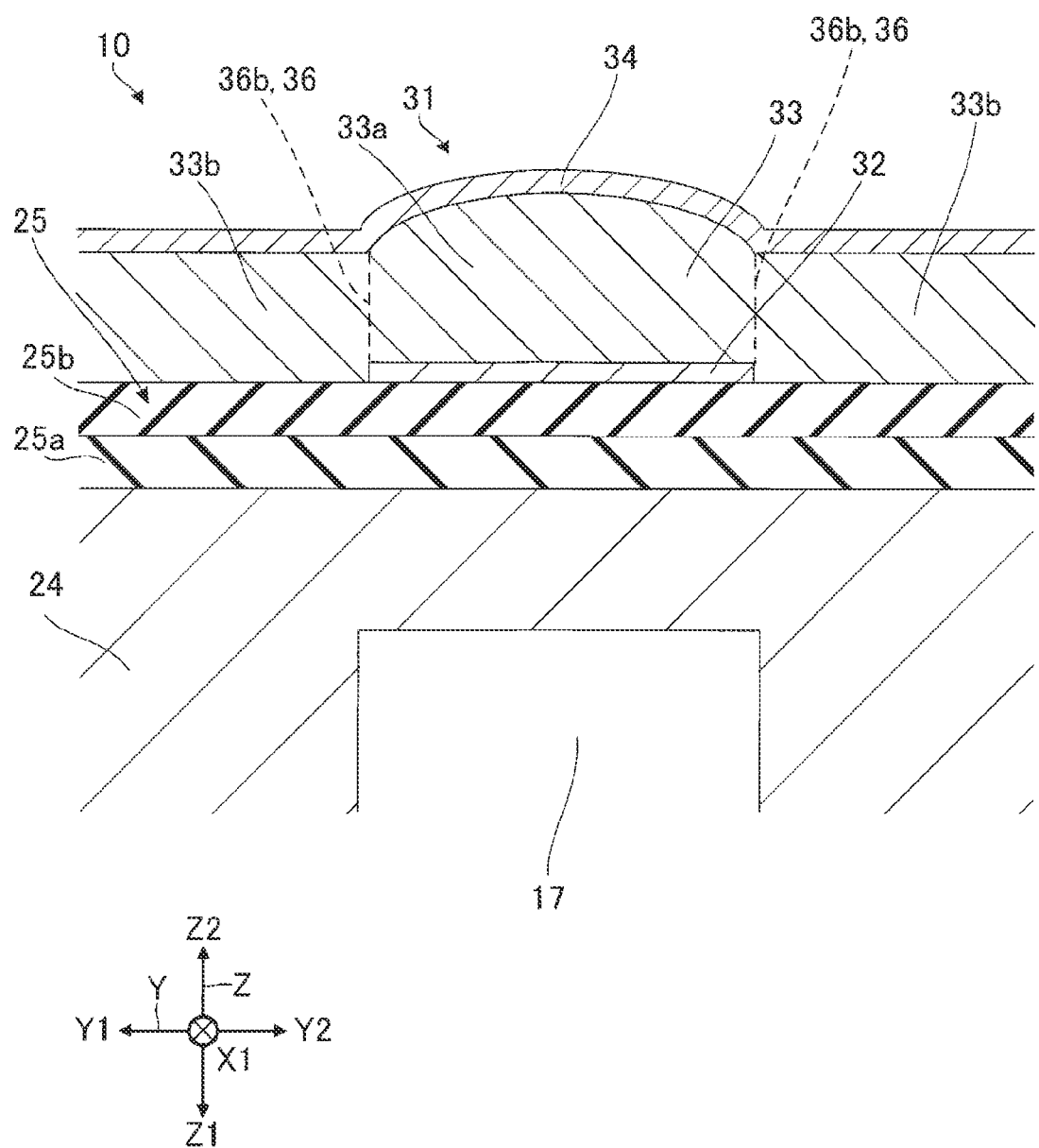
FIG. 4 is a cross-sectional view of the liquid ejecting head taken along a Y-Z plane at an end of an upper electrode in the X-axis direction.

FIG. 3 is an enlarged cross-sectional view of an essential part of the liquid ejecting head 10. FIG. 4 is a cross-sectional view of the liquid ejecting head 10 taken along a Y-Z plane at an end of an upper electrode in the X-axis direction. As illustrated in FIGS. 3 and 4, the diaphragm 25 is disposed on the top surface of the pressure compartment forming substrate 24. The plate-thickness direction of the diaphragm 25 is along the Z axis. The diaphragm 25 covers the openings of the pressure compartment forming substrate 24. The portion, of the diaphragm 25, covering the openings of the pressure compartment forming substrate 24 constitutes the ceiling of the pressure compartments 17. The diaphragm 25 includes a plurality of insulation layers. More specifically, the diaphragm 25 includes an insulation layer 25a made of silicon dioxide ($SiO_2$) and an insulation layer 25b made of zirconium dioxide compartment forming substrate 24. The insulation layer 25b is formed on the insulation layer 25a. The diaphragm 25 is driven by the piezoelectric actuator 31 and vibrates in the Z-axis direction.

The plurality of piezoelectric actuators 31 is disposed on the diaphragm 25. The plurality of piezoelectric actuators 31 is provided such that they correspond to the plurality of pressure compartments 17 respectively. The piezoelectric actuator 31 includes a lower electrode 32, a piezoelectric layer 33, and an upper electrode 34. The lower electrode 32, the piezoelectric layer 33, and the upper electrode 34 are stacked in this order on the diaphragm 25. The lower electrode 32 is an individual electrode(s). The upper electrode 34 is a common electrode. The common electrode may be the lower electrode. The individual electrode may be the upper electrode.

Figure 5:
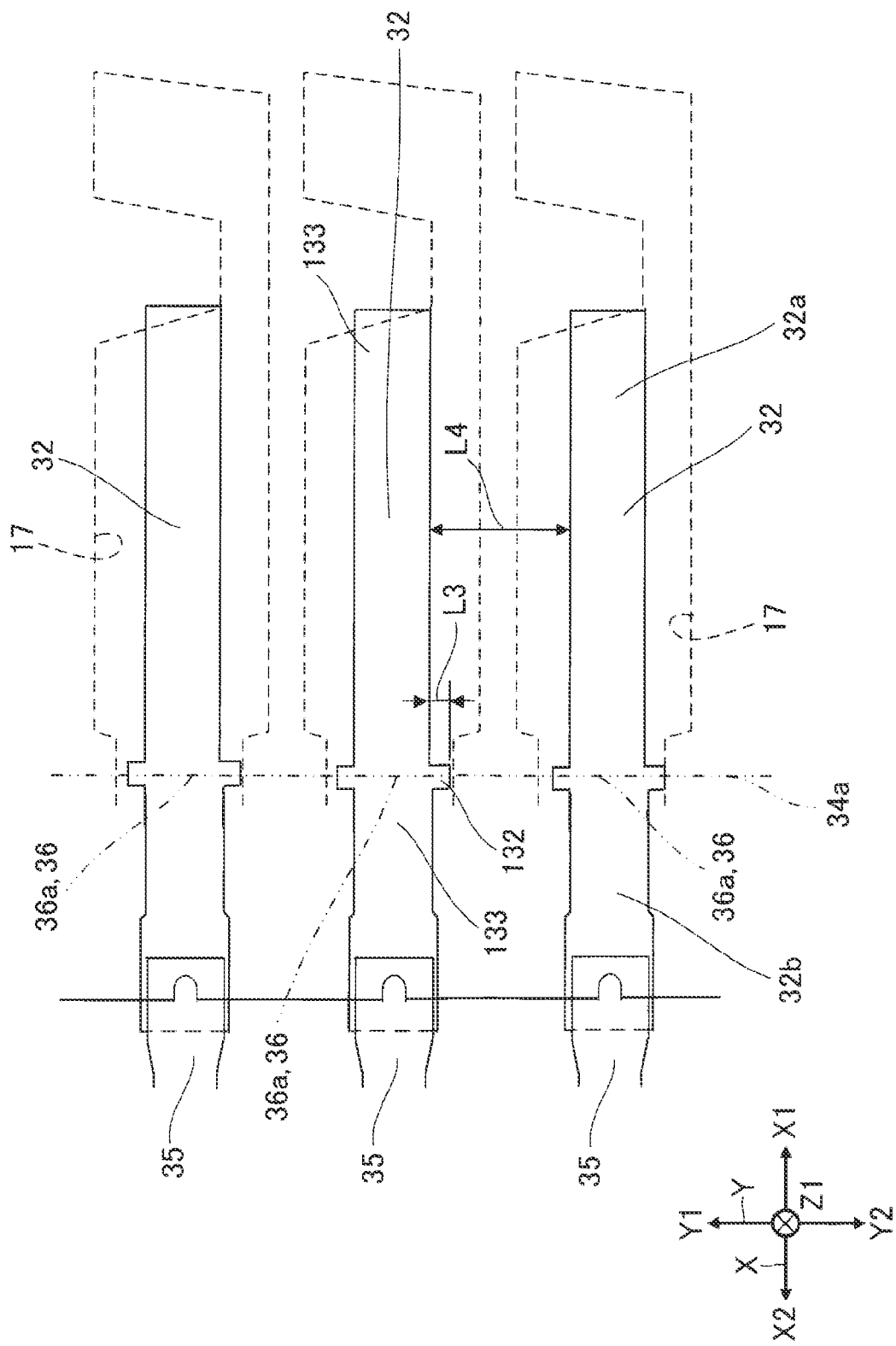
FIG. 5 is a cross-sectional view of the liquid ejecting head taken along an X-Y plane, wherein lower electrodes arranged over pressure compartments are illustrated.

FIG. 5 is a cross-sectional view of the liquid ejecting head 10 taken along an X-Y plane, wherein the lower electrodes 32 arranged over the pressure compartments 17 are illustrated. As illustrated in FIG. 5, the lower electrodes 32 are arranged at predetermined intervals in the Y-axis direction. Each of the plurality of lower electrodes 32 is located at a position overlapping with the corresponding one of the plurality of pressure compartments 17 as viewed in the Z-axis direction. The lower electrode 32 has a predetermined length in the X-axis direction, and extends inward toward the center line O from the position over the pressure compartment 17. The center line O is illustrated in FIG. 2.

The lower electrode 32 includes, for example, an electrode layer containing a conductive material having a low resistance such as platinum (Pt) or iridium (Ir), etc., and a ground layer containing titanium (Ti). The electrode layer may be made of oxide such as, for example, strontium ruthenate ($SrRuO_3$), lanthanum nickelate ($LaNiO_3$), etc.

As illustrated in FIGS. 3 and 4, the piezoelectric layer 33 is formed on the lower electrodes 32. The piezoelectric layer 33 is disposed in such a way as to cover the plurality of lower electrodes 32. The piezoelectric layer 33 is a band-shaped dielectric film extending in the Y-axis direction.

The upper electrode 34 is formed on the piezoelectric layer 33. The upper electrode 34 extends in the Y-axis direction in such a way as to cover the plurality of lower electrodes 32, with the piezoelectric layer 33 sandwiched therebetween. The upper electrode 34 includes, for example, an electrode layer containing a conductive material having a low resistance such as Pt or Ir, etc., and a ground layer containing Ti. The electrode layer may be made of oxide such as, for example, $SrRuO_3$, $LaNiO_3$, etc.

Figure 6:
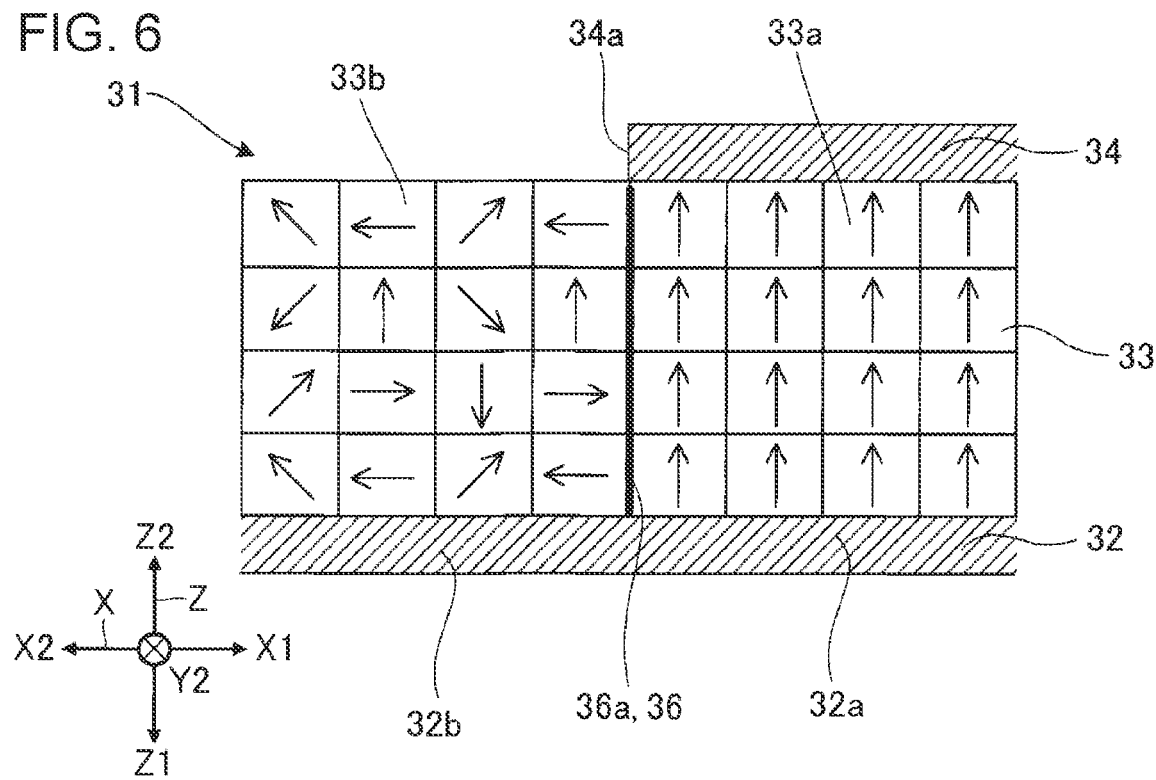
FIG. 6 is a schematic cross-sectional view of a drive region and a non-drive region of a piezoelectric actuator.

FIG. 6 is a schematic cross-sectional view of a drive region 33a and a non-drive region 33b of the piezoelectric actuator 31. As illustrated in FIG. 6, the portion, of the piezoelectric layer 33, sandwiched between the lower electrode 32 and the upper electrode 34 in the Z-axis direction is the drive region 33a. The drive region 33a overlaps with the pressure compartment 17 as viewed in the Z-axis direction. The non-drive region 33b is formed around the drive region 33a as viewed in the Z-axis direction. The lower electrode 32 and the upper electrode 34 do not overlap with each other at the non-drive region 33b.

In FIGS. 3 to 6, a boundary 36 between the drive region 33a and the non-drive region 33b is illustrated. In FIGS. 3 and 4, the boundary 36 is shown by a broken line. In FIG. 5, the boundary 36 is shown by a two-dot chain line. In FIG.

6, the boundary 36 is shown by a solid line. The boundary 36 includes boundaries 36a and 36b. The boundary 36a is the boundary in the X-axis direction. The boundary 36b is the boundary in the Y-axis direction. The boundary 36a is along an end surface 34a of the upper electrode 34 as viewed in the Z-axis direction. The end surface 34a is the X2-side end surface of the upper electrode 34 and extends in the Y-axis direction. The structure of the lower electrode 32 near the boundary 36a will be described later.

As illustrated in FIG. 2, the liquid ejecting head 10 includes a plurality of lead electrodes 35 coupled to the plurality of lower electrodes 32 electrically. Each of the plurality of lead electrodes 35 is coupled to the corresponding one of the plurality of lower electrodes 32. The lead electrode 35 extends in the X-axis direction and is wired to reach the inside of the opening 50 of the sealing plate 40. The opening 50 goes through the sealing plate 40 in the Z-axis direction. The lead electrode 35 is electrically coupled to the COF 60 inside the opening 50.

The lead electrode 35 is made of a conductive material having a lower resistance than that of the lower electrode 32. For example, the lead electrode 35 is a conductive pattern having a layered structure obtained by forming a conductive film made of gold (Au) on the surface of a conductive film made of nichrome (NiCr).

The sealing plate 40 is disposed in such a way as to cover the plurality of piezoelectric actuators 31 from the Z1-directional side. The sealing plate 40 has a rectangular shape as viewed in the Z-axis direction. The sealing plate 40 protects the plurality of piezoelectric actuators 31 and enhances the mechanical strength of the pressure compartment forming substrate 24 and the diaphragm 25.

The sealing plate 40 has a recessed portion 43. The recessed portion 43 is located on both sides with respect to the opening 50 in the X-axis direction. The recessed portion 43 is recessed from the Z1-side surface in the Z2 direction. The recessed portion 43 extends in the Y-axis direction in such a way as to overlap with the plurality of piezoelectric actuators 31 arranged next to one another in the Y-axis direction. As illustrated in FIG. 3, the sealing plate 40 is bonded to the piezoelectric layer 33 by means of an adhesive.

The COF 60 is inserted in the opening 50 and is electrically coupled to the piezoelectric actuator 31 via the lead electrode 35. The COF 60 includes a flexible wiring board 61 and a driver IC 62. The flexible wiring board 61 is a wiring board that has flexibility. The flexible wiring board 61 is, for example, an FPC (Flexible Printed Circuit). The flexible wiring board 61 may be, for example, an FFC (Flexible Flat Cable).

The flexible wiring board 61 is bonded to the diaphragm 25 by means of an adhesive applied to the inside of the opening 50. The driver IC 62 is mounted on the flexible wiring board 61. The driver IC 62 is electrically coupled to the control unit 3 via the flexible wiring board 61. The driver IC 62 receives a command signal outputted from the control unit 3. In response to the command signal, the driver IC 62 supplies a drive signal to each piezoelectric actuator 31 to cause the diaphragm 25 to vibrate.

Next, with reference to FIGS. 5, 6, and 7, the structure of the lower electrode 32 near the boundary 36a will now be explained. As described earlier, the boundary 36a extends along the end surface 34a of the upper electrode 34 in the Y-axis direction.

The lower electrode 32 includes a part 32a and another part 32b. The part 32a is a portion that overlaps with the drive region 33a of the piezoelectric layer 33 as viewed in the Z-axis direction. The part 32b is a portion that overlaps with the non-drive region 33b of the piezoelectric layer 33 as viewed in the Z-axis direction. The part 32b is located adjacent to the part 32a in the X-axis direction. The region that is closer to the lead electrode 35 than the boundary 36a is in the X-axis direction is defined as the part 32b. The region that is farther from the lead electrode 35 than the boundary 36a is in the X-axis direction is defined as the part 32b. In FIGS. 5, 6, and 7, the part 32b exists on the X2-directional side with respect to the boundary 36a, and the part 32a exists on the X1-directional side with respect to the boundary 36a. The part 32a is an example of a first portion. The part 32b is an example of a second portion.

Figure 7:
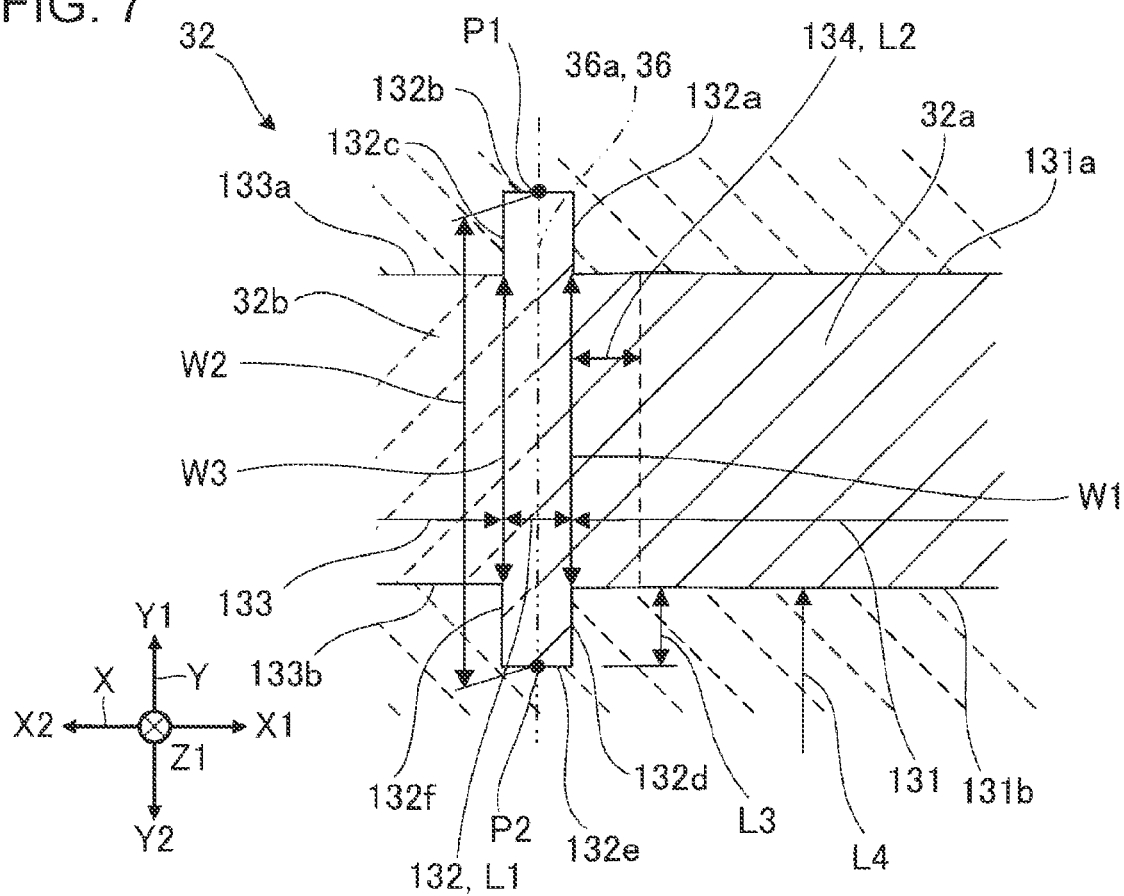
FIG. 7 is a cross-sectional view of an end portion of a lower electrode disposed near a boundary between the drive region and the non-drive region.

As illustrated in FIG. 7, the lower electrode 32 includes a body portion 131, a boundary base portion 132, and a lead-out portion 133. The body portion 131 has a strip shape and extends in the X-axis direction. The body portion 131 is included in the part 32a. The body portion 131 is demarcated by a side 131a and another side 131b. The sides 131a and 131b are at a distance from each other in the Y-axis direction. Each of the sides 131a and 131b extends in the X-axis direction. The region located between the sides 131a and 131b in the Y-axis direction is the body portion 131. The body portion 131 has a width W1, which is a length in the Y-axis direction. The width W1 is the length from the side 131a to the side 131b.

The boundary base portion 132 is located adjacent to the body portion 131 in the X2 direction. The boundary base portion 132 is arranged in such a way as to overlap with the boundary 36a as viewed in the Z-axis direction. The boundary base portion 132 includes a region demarcated by sides 132a, 132b, 132c, 132d, 132e, and 132f. The sides 132a and 132c are at a distance from each other in the X-axis direction. Each of the sides 132a and 132c extends in the Y-axis direction. The sides 132a and 132c are located relatively on the Y1-directional side, as compared with the side 131a. The sides 132d and 132f are at a distance from each other in the X-axis direction. Each of the sides 132d and 132f extends in the Y-axis direction. The sides 132d and 132f are located relatively on the Y2-directional side, as compared with the side 131b.

The sides 132b and 132e are at a distance from each other in the Y-axis direction. Each of the sides 132b and 132e extends in the X-axis direction. The side 132b is a straight line segment connecting the Y1-side end of the side 132a and the Y1-side end of the side 132c to each other. The side 132e is a straight line segment connecting the Y2-side end of the side 132d and the Y2-side end of the side 132f to each other. The region located between the sides 132b and 132e in the Y-axis direction is the boundary base portion 132. The boundary base portion 132 has a width W2, which is a length in the Y-axis direction. The width W2 is the length from the side 132b to the side 132e.

In addition, the width W2 is the length of the boundary 36a in the Y-axis direction. The point P1 is the point where the boundary 36a and the side 132b cross each other as viewed in the Z-axis direction. The point P2 is the point where the boundary 36a and the side 132e cross each other as viewed in the Z-axis direction. The distance between the point P1 and the point P2 is equal to the width W2.

The lead-out portion 133 is demarcated by a side 133a and another side 133b. The lead-out portion 133 is included in the part 32b. The sides 133a and 133b are at a distance from each other in the Y-axis direction. Each of the sides 133a and 133b extends in the X-axis direction. The region located between the sides 133a and 133b in the Y-axis direction is the lead-out portion 133. The lead-out portion 133 has a width W3, which is a length in the Y-axis direction. The width W3 is the length from the side 133a to the side 133b. The lead-out portion 133 is an example of another narrower portion having the width W3, which is less than the width W2.

The lower electrode 32 includes a narrower portion 134 having the width W1. The narrower portion 134 is located on the X1-directional side with respect to the boundary base portion 132. The narrower portion 134 includes, of the body portion 131, a part located adjacent to the boundary base portion 132. The narrower portion 134 is, in the X-axis direction, located relatively on the X1-directional side in comparison with the sides 132a and 132d. The narrower portion 134 has a predetermined length L2 in the X-axis direction. The length of the narrower portion 134 in the X-axis direction may be equal to or approximately equal to the length of the boundary base portion 132 in the X-axis direction.

In the liquid ejecting head 10 having the above structure, the boundary base portion 132 is formed in the lower electrode 32 along the boundary 36a. The width W2 of the boundary base portion 132 is greater than the width W1 of the body portion 131. In addition, the non-drive region 33b of the piezoelectric layer 33 is formed in such a way as to surround the point P1, P2. The range of the drive region 33a existing around the point P1, P2 is less than that of related art. Therefore, it is possible to reduce stress concentration near the point P1, P2, of the lower electrode 32. Consequently, it is possible to prevent or reduce the occurrence of cracking that starts from a position corresponding to the boundary 36a of the lower electrode 32. The structure of the liquid ejecting head 10 makes it possible to prevent or reduce damage near the boundary 36a of the lower electrode 32, thereby improving the reliability of the liquid ejecting head 10.

In the lower electrode 32, the side 132a of the boundary base portion 132 forms a right angle with the side 131a. Similarly, the side 132d of the boundary base portion 132 forms a right angle with the side 131b. Therefore, it is easier to increase the width of the boundary base portion 132 in relation to the body portion 131. This makes it easier to reduce stress concentration.

In the lower electrode 32, the width W3 of the lead-out portion 133 is less than the width W2 of the boundary base portion 132. Because of this structure, it is possible to make a leading-out wire thinner. Such a thinner wire makes wire routing easier.

In the liquid ejecting head 10, the lower electrode 32 is configured as an individual electrode(s). It is easy to form a precise individual electrode pattern on the diaphragm 25. Therefore, in the liquid ejecting head 10, it is possible to easily form the lower electrode 32 that is a precise individual electrode.

In the liquid ejecting head 10, the sealing plate 40 for protecting the piezoelectric actuators 31 is bonded to, of the pressure compartment forming substrate 24 on which the diaphragm 25 is formed, the surface over which the piezoelectric actuators 31 are formed. For example, when wires are thin, it is easier to widen the gap between the wires. This makes it difficult for an applied adhesive to spread through the gap between the wires. Therefore, it is possible to bond the sealing plate 40 well. Consequently, it is possible to protect the piezoelectric actuators 31 securely by the sealing plate 40, thereby improving the reliability of the liquid ejecting head 10.

In the liquid ejecting head 10, the ratio of the protruding length L3 of the boundary base portion 132 to the distance L4 between two lower electrodes 32 located adjacent to each other in the Y-axis direction may be 5% or more and 30% or less. This makes it possible to form the boundary base portion 132 well while maintaining the intervals between the lower electrodes 32 in the Y-axis direction. It is possible to make the width W2 of the boundary base portion 132 greater than the width W1 of the body portion 131. Consequently, it is possible to prevent or reduce damage near the boundary 36a of the lower electrode 32.

Figure 8:
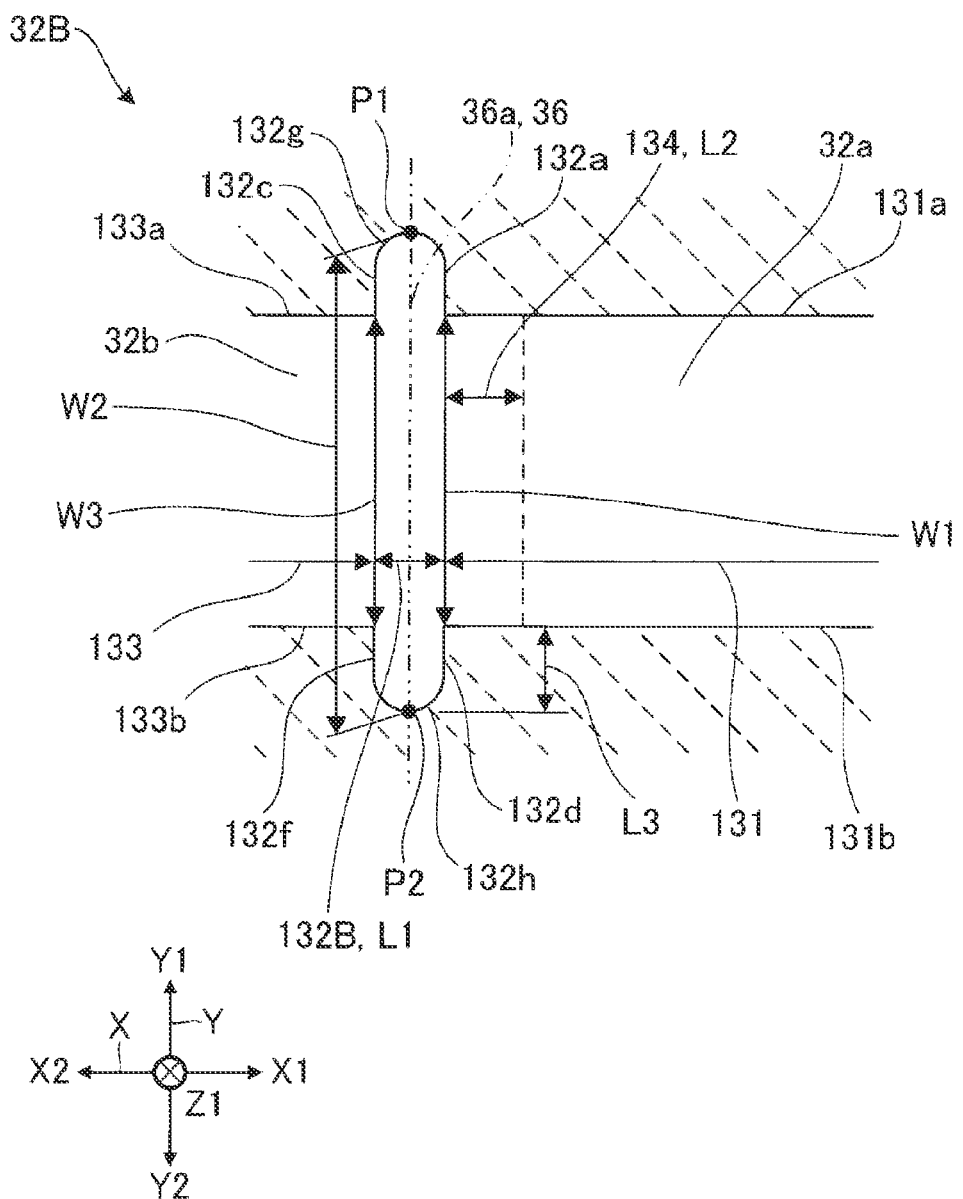
FIG. 8 is a plan view of an end structure of a lower electrode according to a first modification example.

Next, with reference to FIG. 8, an end structure of a lower electrode 32B according to a first modification example will now be explained. FIG. 8 is a plan view of an end structure of a lower electrode 32B according to a first modification example. In FIG. 8, the lower electrode 32B is viewed in the Z1 direction. The end structure of the lower electrode 32B means its structure near the boundary 36a. In the description of the first modification example below, the same explanation as that of the foregoing embodiment will not be given.

The lower electrode 32B according to the first modification example is different from the lower electrode 32 according to the foregoing embodiment in that its boundary base portion 132B has a curved side 132g and another curved side 132h. The sides 132g and 132h are at a distance from each other in the Y-axis direction. The side 132g is a curve connecting the Y1-side end of the side 132a and the Y1-side end of the side 132c to each other. The side 132g is curved in such a way as to bulge in the Y1 direction. The side 132h is a curve connecting the Y2-side end of the side 132d and the Y2-side end of the side 132f to each other. The side 132h is curved in such a way as to bulge in the Y2 direction.

The point P1 is located at the outermost position in the Y1 direction on the side 132g. The point P2 is located at the outermost position in the Y2 direction on the side 132h. The width W1 of the body portion 131 is less than the width W2 of the boundary base portion 132. The boundary base portion 132B protrudes outward in the Y-axis direction beyond the sides 131a and 131b of the body portion 131.

As described above, the sides 132g and 132h of the boundary base portion 132B according to the first modification example may be curved in an arc shape. The liquid ejecting head 10 having the lower electrode 32B described above produces the same operational effects as those of the liquid ejecting head 10 according to the foregoing embodiment.

In the lower electrode 32B, the sides 132g and 132h of the boundary base portion 132B are curved. There is a possibility that the lower electrode 32 and the upper electrode 34 might be misaligned from each other in the processes of manufacturing the piezoelectric actuator 31. If the sides 132g and 132h are curved, as compared with a case where the sides 132g and 132h are straight, the possibility that the sides 132g and 132h and the boundary 36a will overlap will be high, which is desirable.

Figure 9:
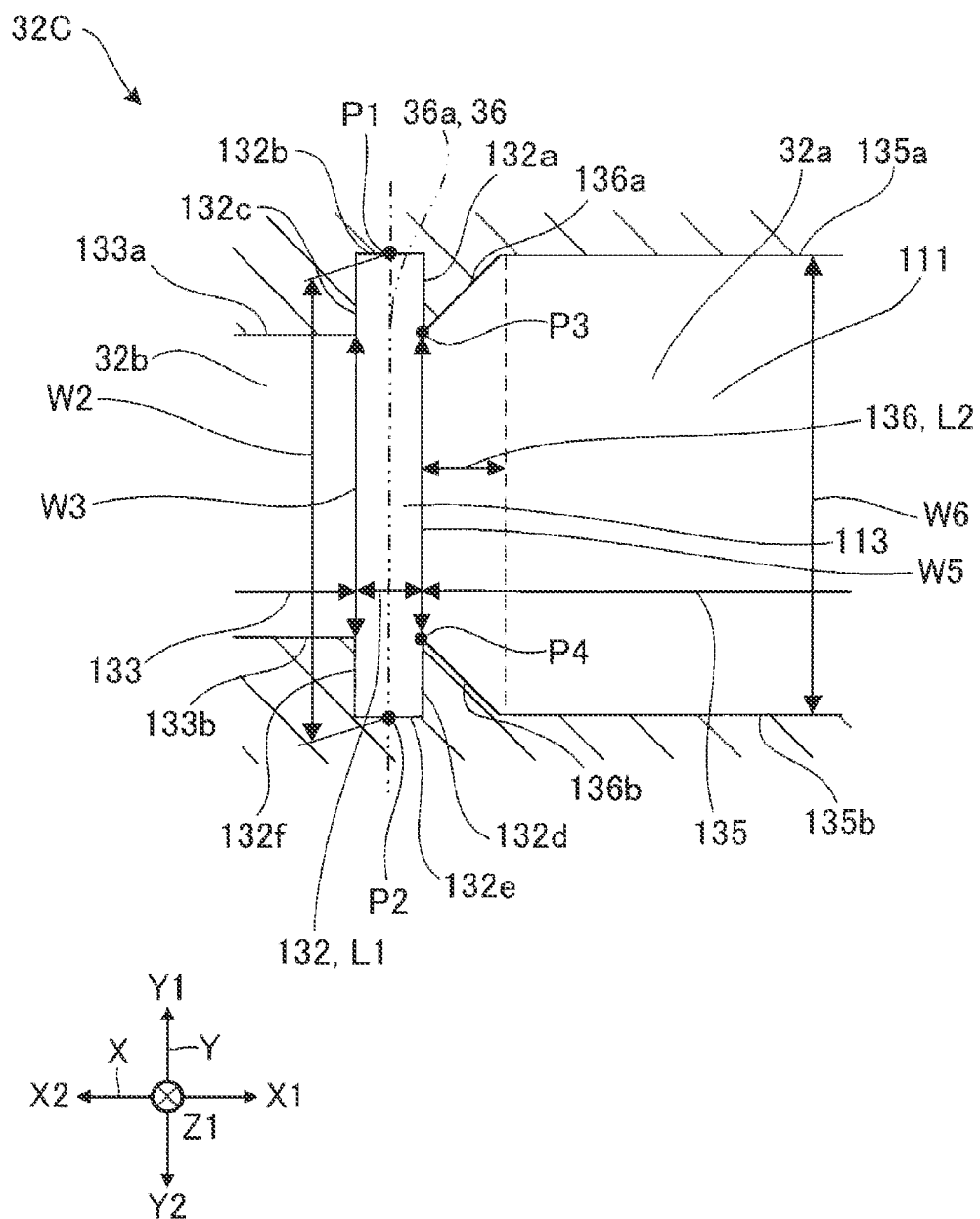
FIG. 9 is a plan view of an end structure of a lower electrode according to a second modification example.

Next, with reference to FIG. 9, an end structure of a lower electrode 32C according to a second modification example will now be explained. FIG. 9 is a plan view of an end structure of a lower electrode 32C according to a second modification example. In the description of the second modification example below, the same explanation as that of the foregoing embodiment will not be given.

The lower electrode 32C according to the second modification example is different from the lower electrode 32 according to the foregoing embodiment in that, firstly, a width W6 between sides 135a and 135b of a body portion 135 is approximately equal to the width W2 of the boundary base portion 132, and, secondly, sides 136a and 136b of a narrower (narrowing) portion 136 are inclined with respect to the X-axis direction.

The sides 135a and 135b are at a distance from each other in the Y-axis direction. Each of the sides 135a and 135b extends in the X-axis direction. The sides 136a and 136b are at a distance from each other in the Y-axis direction. The side 136a extends from the X2-side end of the side 135a toward the X2-directional side. The X2-side end of the side 136a is located relatively on the Y2-directional side, as compared with the X1-side end of the side 136a. The side 136b extends from the X2-side end of the side 135b toward the X2-directional side. The X2-side end of the side 136b is located relatively on the Y1-directional side, as compared with the X1-side end of the side 136b.

The point P3 is located at the X2-side end of the side 136a. The point P3 is the intersection of the side 136a and the side 132a. The point P4 is located at the X2-side end of the side 136b. The point P4 is the intersection of the side 136b and the side 132d. The narrower portion 136 is located on the X1-directional side with respect to the boundary base portion 132. The narrower portion 136 has a predetermined length L2 in the X-axis direction. The width W5, from the point P3 to the point P4, of the narrower portion 136 is less than the width W2 of the boundary base portion 132.

A region 111 between the sides 135a and 135b, within the body portion 135, is an example of a first region. The region 111 has a width W6 going in the Y-axis direction. The width W6 is an example of a first width. The narrower portion 136 is an example of a second region. The width W5 is an example of a second width. A region 113 located on the X1-directional side with respect to the boundary 36a, within the boundary base portion 132, is an example of a third region. The width W2 is an example of a third width. The width W5 is less than the width W6. The width W2 is greater than the width W5.

The liquid ejecting head 10 having the lower electrode 32C according to the second modification example described above produces the same operational effects as those of the liquid ejecting head 10 according to the foregoing embodiment.

In the lower electrode 32C, the region 111 having the width W6, the narrower portion 136 having the width W5, and the region 113 having the width W2 are arranged in this order in the X2 direction. In other words, when each width is defined as a length in the Y-axis direction, an area having a relatively large width, an area having a relatively small width, and an area having a relatively large width are arranged in this order. Since the lower electrode 32C has the structure described above, it is possible to reduce a decrease in the area size of the lower electrode disposed over the pressure compartment 17. Consequently, it is possible to reduce damage to the lower electrode without sacrificing the performance of the piezoelectric actuator 31.

Figure 10:
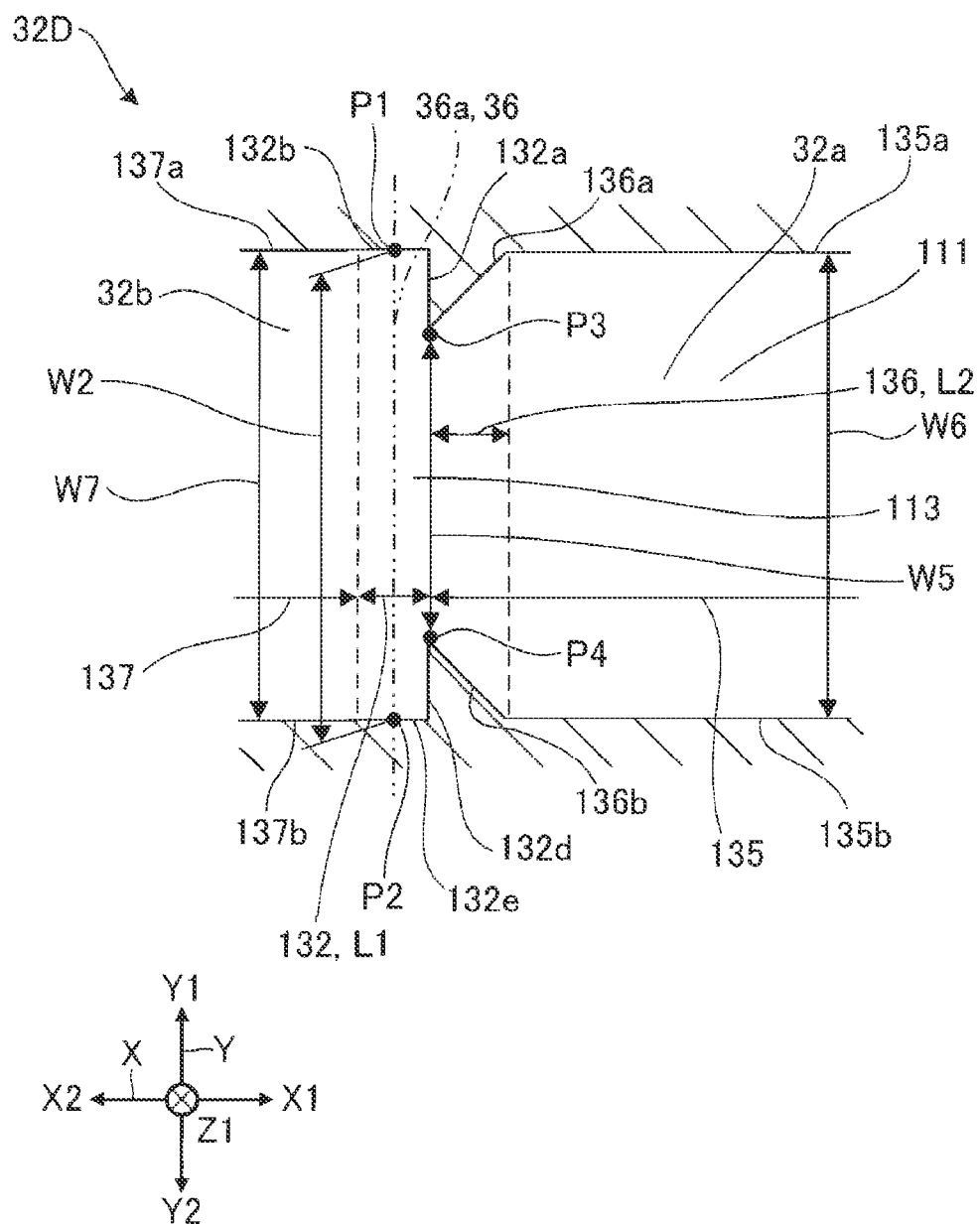
FIG. 10 is a plan view of an end structure of a lower electrode according to a third modification example.

Next, with reference to FIG. 10, an end structure of a lower electrode 32D according to a third modification example will now be explained. FIG. 10 is a plan view of an end structure of a lower electrode 32D according to a third modification example. In the description of the third modification example below, the same explanation as that of the foregoing embodiment will not be given.

The lower electrode 32D according to the third modification example is different from the lower electrode 32C according to the second modification example described above in that a lead-out portion 137 has a width W7 that is approximately equal to the width W2 of the boundary base portion 132. The lead-out portion 137 leads in the X2 direction from the boundary base portion 132.

The lead-out portion 137 has sides 137a and 137b. The sides 137a and 137b are at a distance from each other in the Y-axis direction. Each of the sides 137a and 137b extends in the X-axis direction. Specifically, the side 137a extends from the X2-side end of the side 132b in the X2 direction and the side 137b extends from the X2-side end of the side 132e in the X2 direction. The width W7, which is the length from the side 137a to the side 137b, is approximately equal to the width W2 of the boundary base portion 132.

The liquid ejecting head 10 having the lower electrode 32D according to the third modification example described above produces the same operational effects as those of the liquid ejecting head 10 according to the foregoing embodiment.

Next, with reference to FIG. 11, an end structure of a lower electrode 32E according to a fourth modification example will now be explained. FIG. 11 is a plan view of an end structure of a lower electrode 32E according to a fourth modification example. In the description of the fourth modification example below, the same explanation as that of the foregoing embodiment will not be given.

The lower electrode 32E according to the fourth modification example is different from the lower electrode 32D according to the third modification example described above in that, firstly, sides 138a and 138b of a boundary base portion 138 are inclined with respect to the X-axis direction, and, secondly, a lead-out portion 139 has a width W9 that is greater than the width W8 of the boundary base portion 138.

The sides 138a and 138b of the boundary base portion 138 are at a distance from each other in the Y-axis direction. The side 138a extends from the X2-side end of the side 136a toward the X2-directional side. The X2-side end of the side 138a is located relatively on the Y1-directional side, as compared with the X1-side end of the side 138a. The side 138b extends from the X2-side end of the side 136b toward the X2-directional side. The X2-side end of the side 138b is located relatively on the Y2-directional side, as compared with the X1-side end of the side 138b.

The lead-out portion 139 is located adjacent to the boundary base portion 132 in the X2 direction. Sides 139a and 139c of the lead-out portion 139 are at a distance from each other in the Y-axis direction. The side 139a extends along the line of extension of the side 138a. The X2-side end of the side 139a is located relatively on the Y1-directional side, as compared with the X1-side end of the side 139a. The side 139c extends along the line of extension of the side 138b. The X2-side end of the side 139c is located relatively on the Y2-directional side, as compared with the X1-side end of the side 139c.

Sides 139b and 139d of the lead-out portion 139 are at a distance from each other in the Y-axis direction. Each of the sides 139b and 139b extends in the X-axis direction. The side 139b extends from the X2-side end of the side 139a in the X2 direction. The side 139d extends from the X2-side end of the side 139c in the X2 direction.

The point P5 is located at the intersection of the side 138a and the boundary 36a as viewed in the Z-axis direction. The point P6 is located at the intersection of the side 138b and the boundary 36a as viewed in the Z-axis direction. The boundary base portion 138 is located on the X2-directional side with respect to the narrower portion 136. The boundary base portion 138 has a predetermined length L1 in the X-axis direction. The width W8, from the point P5 to the point P6, of the boundary base portion 138 is greater than the width W5.

A region 114 located on the X1-directional side with respect to the boundary 36a, within the boundary base portion 138, is an example of a third region. The width W8 is an example of a third width.

The width W9 of the lead-out portion 139 is the length from the side 139b to the side 139d. The lead-out portion 139 is an example of a wider portion.

The liquid ejecting head 10 having the lower electrode 32E according to the fourth modification example described above produces the same operational effects as those of the liquid ejecting head 10 according to the foregoing embodiment.

Since the lower electrode 32E includes the lead-out portion 139 whose width W9 is relatively large, it is easier to reduce stress concentration at the boundary base portion 138.

Next, with reference to FIG. 12, a lead electrode 35B according to a fifth modification example will now be explained. FIG. 12 is a plan view of lower electrodes 32 and lead electrodes 35B according to a fifth modification example. The lead electrode 35B according to the fifth modification example is different from the lead electrode 35 according to the foregoing embodiment in that it is inclined with respect to the X-axis direction as viewed in the Z-axis direction.

The lead electrode 35B is bent with respect to the X-axis direction. The bent portion 35a includes a curved portion. The lead electrode 35B may have the curved structure at the portion narrowed from the lower electrode 32.

The foregoing embodiment merely discloses typical examples of the present disclosure. The scope of the present disclosure is not limited to the foregoing embodiment. Various modifications and additions, etc. can be made within a range not departing from the gist of the present disclosure.

The lower electrode 32 of the piezoelectric actuator 31 may have a curved structure at the portion narrowed from the boundary base portion 132. For example, a part of the sides of the body portion 131 may be curved, or a part of the sides of the lead-out portion 133 may be curved. With this structure, it is possible to relax stress acting on the lower electrode 32 near the boundary 36a, thereby preventing the occurrence of cracking in the lower electrode 32.

In the foregoing embodiment, the liquid ejecting apparatus 1 that is a so-called serial-type device configured to reciprocate the carriage 5 on which the liquid ejecting head 10 is mounted has been described to show some examples. However, the present disclosure may be applied to a so-called line-type liquid ejecting apparatus in which the plural nozzles N are arranged throughout the entire width of the medium P.

The liquid ejecting apparatus 1 disclosed as examples in the foregoing embodiment can be applied to not only print-only machines but also various kinds of equipment such as facsimiles and copiers, etc. The scope of application of a liquid ejecting apparatus according to the present disclosure is not limited to printing. For example, a liquid ejecting apparatus that ejects a colorant solution can be used as an apparatus for manufacturing a color filter of a display device such as a liquid crystal display panel. A liquid ejecting apparatus that ejects a solution of a conductive material can be used as a manufacturing apparatus for forming wiring lines and electrodes of a wiring substrate. A liquid ejecting apparatus that ejects a solution of a living organic material can be used as a manufacturing apparatus for, for example, production of biochips.

The actuator 31 disclosed as examples in each embodiment may be used for devices such as, for example, an ultrasonic wave transmitter, an ultrasonic motor, a piezoelectric transformer, a piezoelectric speaker, a piezoelectric pump, a pressure-electricity converter, and the like.

What is claimed is:

1. A piezoelectric actuator, comprising:
   a plurality of individual electrodes;
   a piezoelectric layer; and
   a common electrode; wherein
   the plurality of individual electrodes, the piezoelectric layer, and the common electrode are stacked in layers on a diaphragm,
   in a three-axis coordinate system having an X-axis as a first direction, a Y-axis as a second direction, and a Z-axis as a stack direction, where the X-axis, the Y-axis, and the Z-axis are orthogonal to one another, the plurality of individual electrodes each extend in the first direction and are each arranged in the second direction,
   the piezoelectric layer includes a drive region, which is sandwiched between the individual electrode and the common electrode in the stack direction, and a non-drive region, which is located adjacent to the drive region and is not sandwiched between the individual electrode and the common electrode in the stack direction,
   the individual electrode has a first portion, which overlaps with the drive region as viewed in the stack direction, and a second portion, which overlaps with the non-drive region as viewed in the stack direction and is located adjacent to the first portion in the first direction, and
   the first portion includes a narrower portion whose width is less than a width in the second direction at a boundary between the first portion and the second portion.

2. The piezoelectric actuator according to claim 1, wherein
   the individual electrode is a lower electrode formed on the diaphragm.

3. The piezoelectric actuator according to claim 1, wherein
   the first portion includes a first region, a second region, and a third region,
   the first region is located over a pressure compartment and has a first width in the second direction,
   the second region is included in the narrower portion, is located at a position closer to the boundary than the first region is, and has a second width that is less than the first width, and
   the third region is located at a position closer to the boundary than the second region is, and has a third width that is greater than the second width.

4. The piezoelectric actuator according to claim 1, wherein
   the second portion includes a wider portion whose width in the second direction is greater than the width at the boundary.

5. The piezoelectric actuator according to claim 1, wherein
   the second portion includes another narrower portion whose width in the second direction is less than the width at the boundary.

6. The piezoelectric actuator according to claim 5, further comprising:
   a protective substrate that covers the plurality of individual electrodes, the piezoelectric layer, and the common electrode from an opposite side with respect to pressure compartments, wherein the protective substrate is bonded to a pressure compartment forming substrate, inside which the pressure compartments are formed, by using an adhesive.

7. The piezoelectric actuator according to claim 5, wherein the another narrower portion has a curved portion.

8. The piezoelectric actuator according to claim 1, wherein the individual electrode has, as viewed in the stack direction, an edge that intersects with an edge of the common electrode at the boundary and extends straight in the first direction.

9. The piezoelectric actuator according to claim 1, wherein the individual electrode has, as viewed in the stack direction, an edge that intersects with an edge of the common electrode at the boundary and extends in a curved manner.

10. The piezoelectric actuator according to claim 1, wherein a protruding length in the second direction from an edge where the narrower portion has a minimum width to an edge of the boundary is 5% or more and 30% or less in relation to a distance between adjacent two of the individual electrodes in the second direction.

11. A liquid ejecting head, comprising:

the piezoelectric actuator according to claim 1; and a pressure compartment forming substrate, inside which pressure compartments are formed; wherein the drive region is located over the pressure compartment.

12. A recording apparatus, comprising:

the liquid ejecting head according to claim 11.

\* \* \* \* \*